(12) United States Patent
Nakanishi et al.

(10) Patent No.: US 6,513,993 B1
(45) Date of Patent: Feb. 4, 2003

(54) OPTICAL COMMUNICATIONS DEVICE

(75) Inventors: Hiromi Nakanishi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/856,899

(22) PCT Filed: Sep. 22, 2000

(86) PCT No.: PCT/JP00/06543

§ 371 (c)(1),
(2), (4) Date: May 29, 2001

(87) PCT Pub. No.: WO01/23932

PCT Pub. Date: Apr. 5, 2001

(30) Foreign Application Priority Data

Sep. 28, 1999 (JP) .......................................... 11-274446

(51) Int. Cl.[7] ................................................. G02B 6/36
(52) U.S. Cl. ........................................................ 385/92
(58) Field of Search ............................. 385/92, 44, 88, 385/89, 90, 91, 49, 14

(56) References Cited

U.S. PATENT DOCUMENTS 5,764,826 A * 6/1998 Kuhara et al. ................. 385/24

FOREIGN PATENT DOCUMENTS

| JP | 8-83955 | 3/1996 |
|---|---|---|
| JP | 10-227952 | 8/1998 |
| JP | 10-242505 | 9/1998 |
| JP | 10-332989 | 12/1998 |
| JP | 11-109186 | 4/1999 |
| JP | 11-218651 | 8/1999 |
| JP | 11-295558 | 10/1999 |

OTHER PUBLICATIONS

"Receptacle Type Bi–directional WDM Module I" by Masahiro Kogusu, et al., Electronics Society 1996 of the Institute of Electronics, Information and Communication Engineers, C–208 p208 and English translation.

* cited by examiner

*Primary Examiner*—Javaid Nasri
(74) *Attorney, Agent, or Firm*—Smith, Gambrell & Russell, LLP

(57) ABSTRACT

The invention reduces the costs of a surface mounting type receiver module, transmitter module, and transmitter and receiver module.

In an optical communication device comprising an optical fiber, optical parts, and a substrate for optical coupling, the coupling portion between the end portion of the optical fiber and the optical parts is fixed by a semiconductor substrate having a V groove made by etching, and a portion of the optical fiber other than the end portion is fixed by a retaining substrate which is different from the semiconductor substrate.

16 Claims, 13 Drawing Sheets

LD Module of the prior art

Surface Mounting type module of the prior art

Embodiment 1

Embodiment 2

Embodiment 3

Embodiment 4

Embodiment 5

Embodiment 6

Embodiment 6

Embodiment 7

Embodiment 8

Embodiment 9

OPTICAL COMMUNICATIONS DEVICE

TECHNICAL FIELD

The present invention relates to a transmitter module, receiver module, or transmitter and receiver module in optical communication. Especially it relates to a surface mounted type optical communication device that can achieve the reduction of substrate cost.

BACKGROUND ART

As a transmitter module in an optical communication device, three-dimensional semiconductor laser module 1 as shown in FIG. 1 has been successfully manufactured and marketed. A transmission signal is converted into light by semiconductor laser 2, and transmitted to optical fiber 13 via lens 9 and ferrule 12. On base 4 which is called a header, photodiode 3, semiconductor laser 2 and attaching pole 5 are housed within cap 7, and the entirety is housed inside lens holder 10. This module is electrically connected to the outside of housing 11 by lead pins 6.

Recently, another type of transmitter and receiver module has been proposed, in which a wavelength division multiplexing filter (hereinafter referred to as a WDM filter in the present specification and claims), a photodiode (hereinafter referred to as a PD in the present specification and claims), and a semiconductor laser (hereinafter referred to as an LD in the present specification and claims) are installed (①p208, "Receptacle Type Bidirectional Wavelength Division Multiplexing Optical Module" written by Masahiro Kogusu, Tazuko Tomioka, and Shigeru Oshima, Electronics Society 1996 of the Institute of Electronics, Information and Communication Engineers, C-208). (There are PD/LD descriptions in the embodiments of the present specification and claims; however, this means either a PD or an LD, or an optoelectronic converter device equivalent to these).

However, the three-dimensional module needs many parts including the housing and it consumes time to align the optical axes, so its material cost and manufacturing cost are currently high. In order to reduce the cost and size of the three-dimensional module, a surface mounting type module 14 as shown in FIG. 2 is being developed (Japanese Unexamined Patent Publication No. 332989 of 1998).

In this module, the package surface and the optical fiber surface are parallel to each other, and light is propagated horizontally near the substrate surface. The space between the end of the optical fiber and the LD/PD can be reduced to be extremely narrow. Therefore, this module is small in size, and when the module is mounted on a printed circuit board, the optical fiber is in parallel with the printed circuit board, so that the circuit board does not greatly increase in size. Therefore, it can be expected that the parts cost is reduced and alignment becomes unnecessary. An Si semiconductor single crystal substrate (hereinafter referred to as an Si bench in the present specification and claims) 16 is provided inside mount 15 which is a package of the module 14. Optical part LD/PD 19 and optical fiber 22 are attached to the Si bench 16.

Large V groove 17 and V groove 18 are formed at the center part of the Si bench 16 by means of anisotropic etching. LD/PD 19 is attached to upper step portion 20 which is one step higher than the portion with the V groove. A metallized pattern is printed on this upper step portion. The LD/PD 19 is fixed at a predetermined position based on an alignment mark. Ferrule 21 is pushed against the large V groove 17, and optical fiber ribbon 22 at the front end of the ferrule is pushed against and fixed in the V groove 18. The advanced development of photolithography technology enables accurate positioning of the optical fiber and optical parts. The use of the Si semiconductor single crystal as a bench has such advantages.

In the surface mounting type module, highly accurate photoetching technology for the semiconductor technology enables to form accurately the large V groove 17 and the V groove 18 which fix the optical fiber onto the Si bench, the metallized pattern for fixing the LD/PD 19, and the alignment mark. Since the optical fiber is positioned by the large and small V grooves and the optical parts are mounted at correct positions based on the mark, the optical parts are caused to exist correctly on the optical axial line of the optical fiber. Even if the LD is not caused to emit light for alignment, the fiber can be mounted. Hence this method is called passive alignment. By this technology, mounting can be automatized, and the cost reduced. More specifically, the material cost and assembly cost are reduced to be lower than those of the module of FIG. 1. Therefore, it is considered that a small-sized transmitter/receiver of a low price can be achieved by this surface mounting. However, the material cost for the Si bench increases the price of the module. The Si bench requiring Si with a wide area is high cost part which influences the total cost of the module.

In actuality, among the devices comprising the surface mounting type transmitter and receiver module, including the LD, PD, package (resin package), lead frame, and Si bench, the most expensive part is the Si bench. A reduction in the cost of the Si bench is essential to further lower the price of a transmitter module, a receiver module, and a transmitter and receiver module. A first object of the invention is to reduce the cost of the Si bench. A second object of the invention is to provide an inexpensive optical communication device by reducing the Si bench cost.

DISCLOSURE OF THE INVENTION

The present inventor, considering these points from various perspectives, noted that the accuracy in μm units was required only at the optical coupling portion including the optical fiber front end and LD chip light emitting portion in the surface mounting device which is encircled by the broken line in FIG. 2 and FIG. 3. If this portion deviates, light from the LD cannot enter the optical fiber. Therefore, it is important that the optical coupling portion be in alignment. Strict accuracy is not required at other portions. Slight shifting of the ferrule causes no serious problem.

In the present invention, only the optical coupling portion which needs high accuracy is placed on the Si bench, and other devices and the Si bench itself are placed on another inexpensive retaining substrate. The cost per unit area of the retaining substrate is lower than the cost per unit area of the Si bench, so that the substrate cost can be reduced.

In the present invention, the Si bench is used only for the optical coupling portion. For the other portion a composite substrate structure formed from materials other than the Si semiconductor single crystal, for example, ceramic and a resin is used. The optical coupling portion is placed on the Si bench since it requires high accuracy. The other portion is placed on a retaining substrate that is lower cost and also lower accuracy. The Si bench and the retaining substrate are combined and used to meet the requirements of cost and accuracy. This is the core of the invention.

The optical communication device of the invention is comprised of an optical fiber, optical parts, and a substrate for optical coupling. The coupling portion between the optical fiber end part and the optical parts is fixed by a semiconductor substrate having V grooves formed by means of etching. And one portion at the other end of the optical fiber is fixed by a retaining substrate which is different from the abovementioned semiconductor substrate.

DETAILED DESCRIPTION OF THE DRAWINGS

BEST MODE FOR CARRYING OUT THE INVENTION

Figure 1:
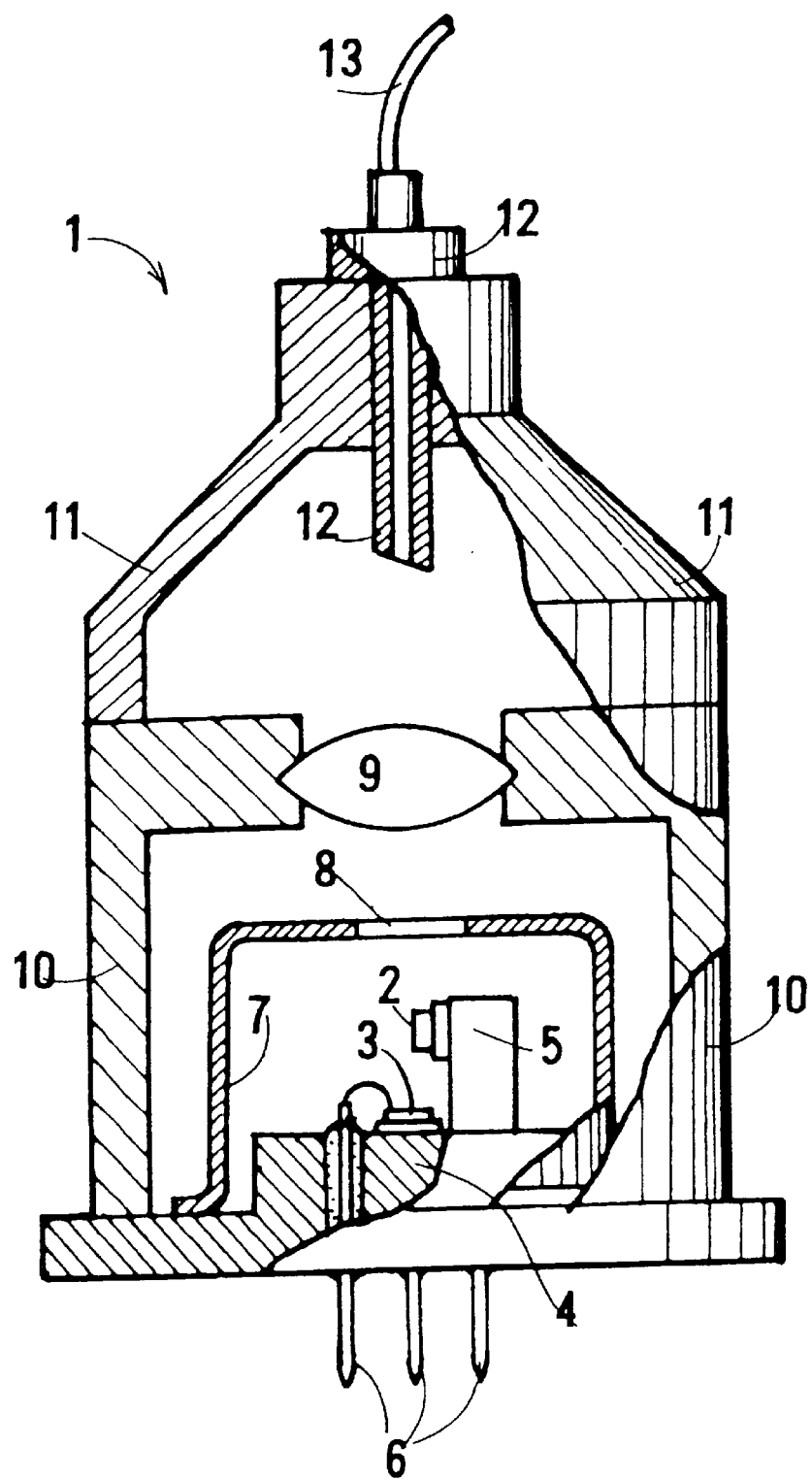
FIG. 1 is a longitudinal section of an LD module of a three-dimensional type relating to the conventional example.

The present invention provides an optical communication device having a double structure comprising a semiconductor single crystal substrate and a retaining substrate. The semiconductor substrate, which forms a coupling portion between an optical fiber and optical parts such as an LD and a PD, means an Si, GaAs, or InP substrate. The Si substrate has been most frequently used. Grooves are made by means of anisotropic etching, so that a semiconductor single crystal other than Si can be used.

An optical fiber transmits and receives signals, and an optical fiber with a ferrule can be supported by a retaining substrate. Or, an optical fiber cover itself may be supported by a retaining substrate.

Grooves are cut in the retaining substrate for fixation of the optical fiber cover part or the ferrule onto the retaining substrate, and the optical fiber or the ferrule can be embedded in the respective grooves and fixed. (In the case where the optical fiber is fixed onto the retaining substrate, the optical fiber may be fixed via a ferrule or fixed directly, so that "a ferrule with an optical fiber or an optical fiber" is referred to as "a ferrule or the like" in the present specification and claims hereinafter.)

Substrates except for semiconductor substrates can be used as the retaining substrate. For example, the substrate may be formed from ceramic such as alumina or zirconia. Or, a retaining substrate made from a resin may be used. In addition, a retaining substrate can be made from liquid crystal polymers.

The invention can be applied to all of a receiver module having only a light receiving element, a transmitter module having only a light emitting element, and a transmitter and receiver module having both a light receiving element and a light emitting element.

In the case of the receiver module, an amplifier may be provided near the PD.

In the case of the transmitter module, a monitoring PD may be provided behind the LD.

In the case of the transmitter module or receiver module, light with an optional wavelength can be used as transmission light. For example, light with a wavelength of a 1.3 $\mu$m band or 1.5 $\mu$m band can be used.

In the case where the invention is applied to the transmitter and receiver module, the module can be used as an optical subscriber system module for wavelength division multiplexing communication. The wavelength division multiplexing communication means communication in which receiving light and transmitting light have different wavelengths. By using transmitting light and receiving light which have different wavelengths for transmission and receiving, bidirectional simultaneous communication is possible. For example, transmitting light may be in a 1.3 µm band and receiving light may be in a 1.55 µm band. To the contrary, transmitting light may be in the 1.55 µm band and receiving light may be in the 1.3 µm band. In the case of the transmitter and receiver module, transmitting light and receiving light are separated by a WDM filter for a wavelength division multiplexing communication module, and a method in which the optical paths are different can be used. Or, transmitting light and receiving light may be made to pass the same path, separated by a WDM filter, and made incident onto the PD.

In the case where the invention is applied to the transmitter and receiver module, light with the same wavelength can be used for transmission and receiving. In this case, simultaneous bidirectional communication is not possible, therefore light is time-divided for transmission and receiving. Also, in this case, transmitting light and receiving light can be made to propagate along different paths. In this case, a half mirror is used for separating light in place of a WDM filter. Or, transmitting light and receiving light may be made to propagate along almost the same path in opposite directions. At this time, light is also separated by a half mirror.

With respect to such near infrared light, a PD or an APD having an InGaAs or InGaAs light receiving layer may be used as a light receiving element. Or, an InGaAsP-based LD may be used as a light receiving element.

The present invention shall be described in detail based on embodiments hereinafter.

Embodiment 1

Figure 6:
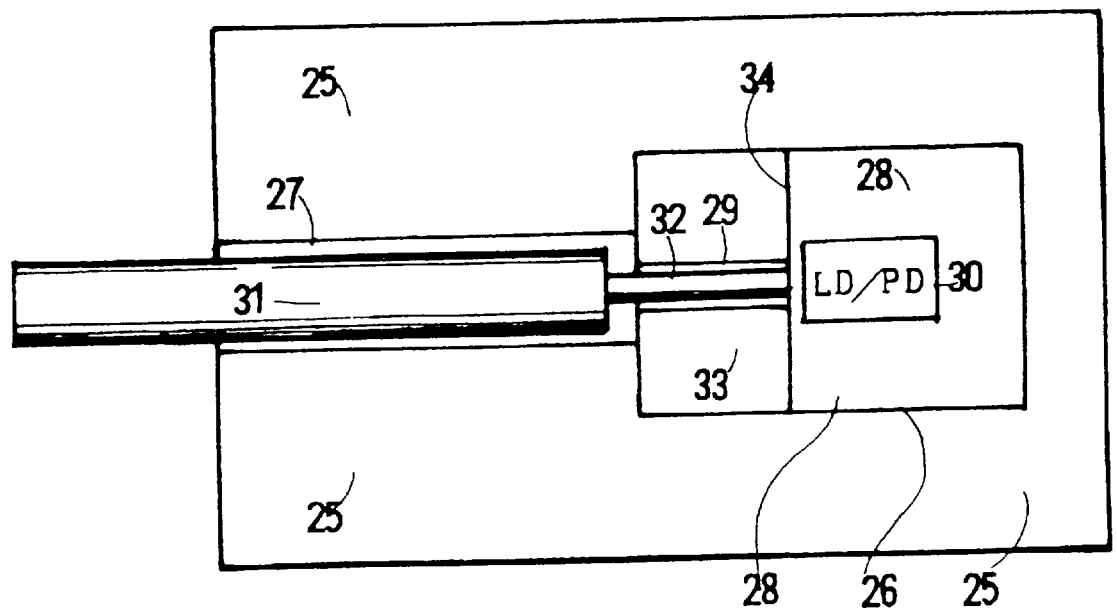
FIG. 6 is a plane view of a transmitter module or receiver module in which the Si bench is united with a retaining substrate, which relates to embodiment 1.
Figure 7:
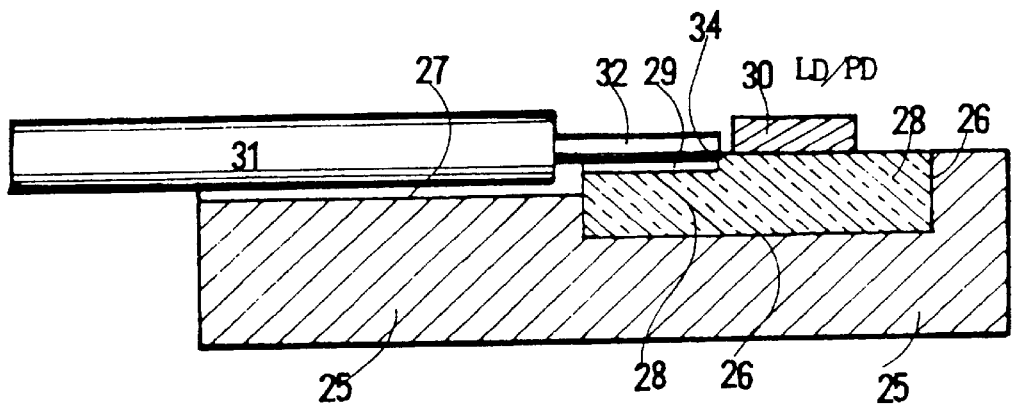
FIG. 7 is a sectional view of a transmitter module or receiver module in which the Si bench is united with a retaining substrate, which relates to embodiment 1.

FIG. 6 is a plane view of embodiment 1 and FIG. 7 is a longitudinal section of the same. Retaining substrate 25 is a rectangular plate in which a shallow and rectangular fitting hole 26 and optical fiber fixing hole 27 extending in the direction of the optical axis to the fitting hole are formed in the surface. Si bench 28, which has the same size as that of the fitting hole 26, is embedded in the fitting hole 26. The surfaces of the Si bench 28 and the retaining substrate 25 come to almost the same height. Thin V groove 29 is formed in the direction of the optical axis in the front lower portion 33 of the Si bench 28 by means of anisotropic etching. Optoelectronic converter device optical part LD/PD 30 is fixed on the Si bench along the extended line from the V groove 29. Hereinafter, the lengthwise direction of the optical fiber in the case where optical signals are made incident onto and exit from the module through the optical fiber is defined to be the direction of the optical axis.

Ferrule 31 or the like is inserted into the optical fiber fixing groove 27, and optical fiber ribbon 32 is inserted into the V groove 29. These fixing portions are adhered with an adhesive. The horizontal position of the optical fiber ribbon 32 is determined by the V groove 29. Furthermore, the front end of the ribbon comes into contact with the step portion 34 of the Si bench, whereby the position in the axial direction is determined. When the LD/PD 30 is an LD, the module is a transmitter module, and transmitting light exits from the LD and enters the optical fiber. When the LD/PD 30 is a PD, receiving light from the optical fiber enters the PD from the side. In this case, the PD is a sideward incident type itself. Or a means is required whereby the PD is equivalent to a sideward incidence type, such that the PD is installed vertically, or receiving light is further reflected and refracted so as to be guided to the front surface and the back surface.

The Si bench is formed so as to have a length of 5 mm and a width of 3 mm. In conventional examples, the dimensions of the Si bench are about 9 mm×5 mm=45 mm². In this embodiment, an Si bench with an area of approximately ⅓ of that of the conventional bench is used. Thereby, the cost of the Si substrate is reduced to approximately one third.

An epoxy resin, a liquid crystal polymer, a plastic molded member, ceramic, or the like can be used for the retaining substrate 25 which retains the ferrule portion and the Si bench itself. The epoxy resin has satisfactory results as an electric circuit board since the resin has been frequently used for printed circuit boards. Both thermoplastic resin and thermosetting resin can be used as plastic. An optional material can be selected from alumina, zirconia, garnet, and others for the ceramic. A fitting hole or an optical fiber fixing groove must be formed in the retaining substrate in advance. Excellent moldability is desired.

Herein, a liquid crystal polymer is used for the retaining substrate. The liquid crystal polymer can be accurately molded. It can also be metallized. This polymer is a suitable material for the retaining substrate. The retaining substrate has dimensions of 11 mm(L)×7 mm(W)×2 mm(t) in embodiment 1.

Figure 2:
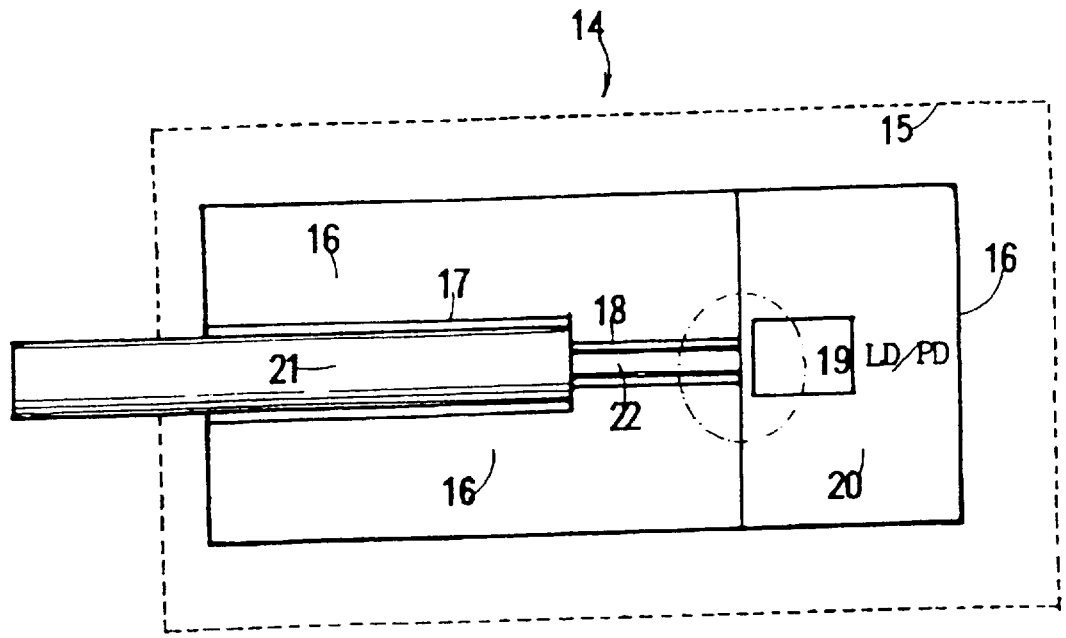
FIG. 2 is a plane view of a surface mounting type module in which an Si bench is used as a retaining substrate, which relates to the conventional example.
Figure 3:
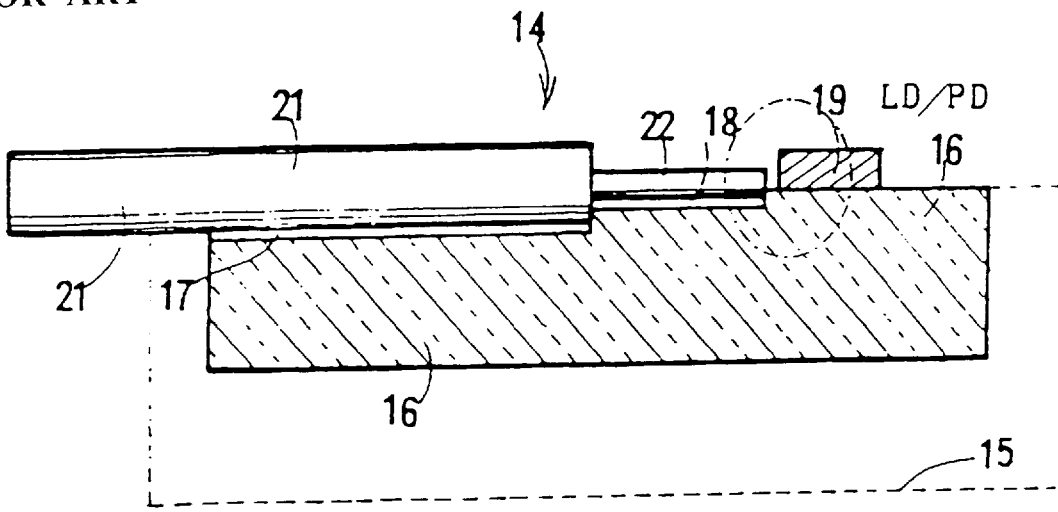
FIG. 3 is a longitudinal section of a surface mounting type module in which an Si bench is used as a retaining substrate, which relates to the conventional example.

An example is explained in which the invention is applied to a transmitter. The front end of an optical fiber and a 1.3 µmLD of InGaAsP were attached onto the Si substrate 28, the Si substrate was fixed by the liquid crystal polymer, provided with a lead frame, and then mounted inside a package. It was confirmed that this LD module had a coupling power and temperature stability equal to that of FIG. 2 and FIG. 3.

Embodiment 2

Figure 8:
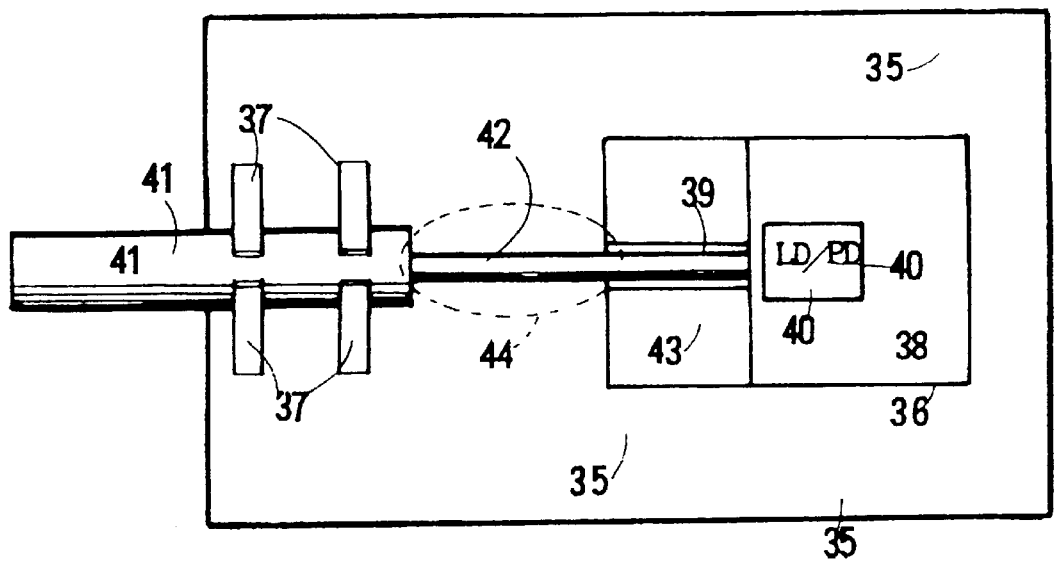
FIG. 8 is a plane view of a transmitter module or a receiver module in which a lead frame is used as a retaining substrate, which relates to embodiment 2.
Figure 9:
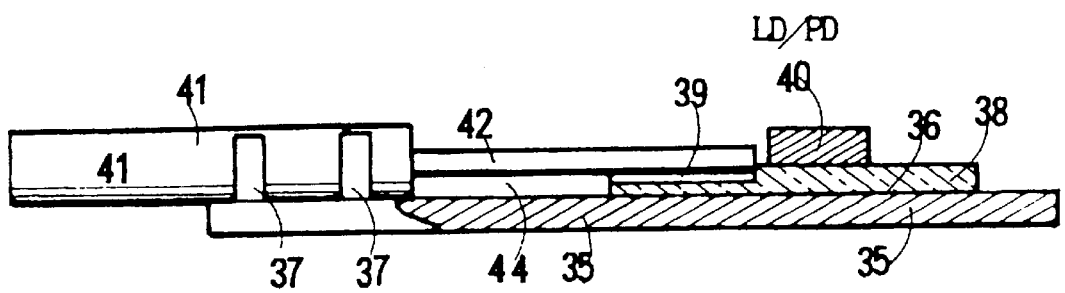
FIG. 9 is a sectional view of a transmitter module or a receiver module in which a lead frame is used as a retaining substrate, which relates to embodiment 2.

In embodiment 2, the lead frame itself is used simultaneously as the retaining substrate. It has a significant effect on cost reduction since the lead frame is essential for the module. FIG. 8 is a plane view of embodiment 2, and FIG. 9 is a longitudinal section of the same. The lead frame 35 functions not only as the lead frame itself but also as a retaining substrate. The lead frame is a thin metal plate made from a good conductor, which is provided with a number of pins directed inward at the four sides. Herein, illustration of the pins is omitted. Some portions of the lead frame 35 are cut and raised to form fixing claws 37. The frame is a flat metal plate, so that fitting holes cannot be made in the plate. An adequate attaching portion 36 is selected, and Si bench 38 is fixed to this portion by a conductive adhesive. The Si bench 38 is higher due to its thickness than the surface of the lead frame 35 which is the retaining substrate. Thin V groove 39 directing the optical axis is formed in the front lower portion 43 of the Si bench 38 by means of anisotropic etching. Optical parts LD/PD 40 are fixed on the Si bench along the extended line from the V groove 39.

The ferrule or the like 41 is fixed to the lead frame 35 by the fixing claws 37. The optical fiber ribbon 42 is inserted and adhered in the V groove 39. The horizontal position of the optical fiber ribbon 42 is accurately determined by the V groove 39. The front end of the ribbon comes into contact with the step portion of the Si bench, whereby the position in the axial direction of the ribbon is determined. In the case where the LD/PD 40 is an LD, a transmitter module is formed, and transmitting light from the LD enters the optical fiber. In the case where the LD/PD 40 is a PD, receiving light that exited from the optical fiber enters the PD from the side. In this case, the PD is a sideward incident type itself. Or a means is required whereby the PD is equivalent to a sideward incidence type, such that the PD is installed vertically, or receiving light is further reflected and refracted so as to be guided to the front surface and the back surface.

The Si bench has a length of 5 mm and a width of 3 mm. These dimensions are the same as those of embodiment 1. Plastic, ceramic, and liquid crystal polymers or the like are not used for the retaining substrate. The retaining substrate is attached directly to the lead frame. The lead frame is always used. The liquid crystal polymer is attached to the lead frame in embodiment 1, so that the direct use of the lead frame as the retaining substrate in embodiment 2 results in the reduction in the whole retaining substrate. This structure is extremely effective in terms of the price.

In this example, the front end of the optical fiber and the LD are attached onto the small Si bench. This Si bench 38 is bent on the metallic lead frame made from Cu or Al by a conductive resin. Claws are in a vertical posture at some portions, and ferrule 41 is sandwiched and fixed by the claws. The spare space 44 between the fixing claws 37 and the Si bench 38 are taken to be wide, and the exposed portion of the optical fiber is lengthened by 1 to 2 mm. Thereby, even if the optical fiber slightly deviates from the optical axes of the ferrule fixing portion and the optical coupling portion, the deviation can be absorbed.

Embodiment 3

Figure 10:
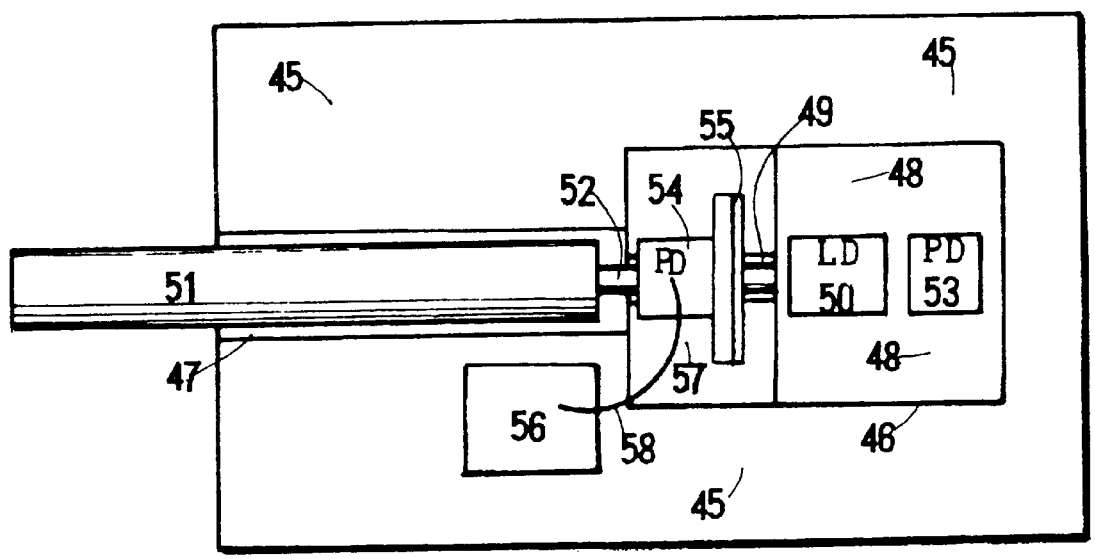
FIG. 10 is a plane view of a transmitter and receiver module in which a receiver PD and a monitor PD are mounted on an Si bench, which relates to embodiment 3.
Figure 11:
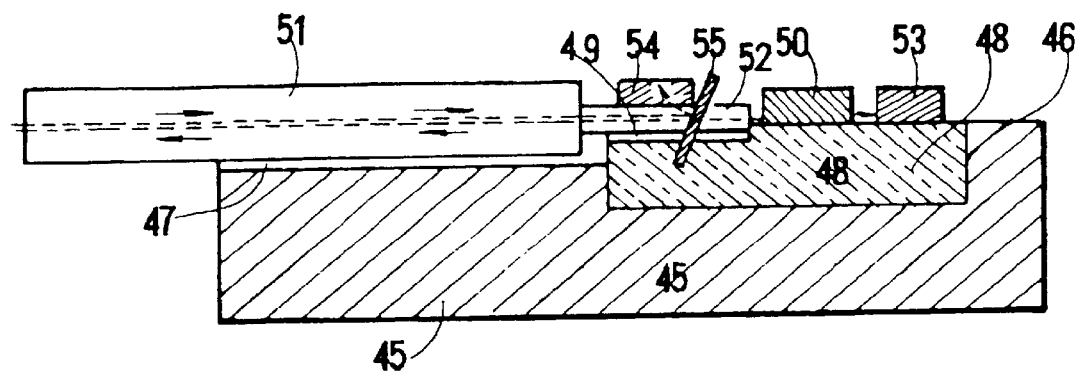
FIG. 11 is a sectional view of a transmitter and receiver module in which a receiver PD and a monitor PD are mounted on an Si bench, which relates to embodiment 3.

The modules explained above are solely for transmission or receiving. The invention can also be applied to a device which serves both transmission and receiving. Embodiment 3 is a transmitter and receiver module. In a conventional transmitter and receiver module, the optical paths are different for transmitting light and receiving light, however, this embodiment to be proposed herein is a transmitter and receiver module in which the optical paths for transmitting light and receiving light are almost the same. FIG. 10 is a plane view of embodiment 3, and FIG. 11 is a longitudinal section of the same.

Retaining substrate 45 is a rectangular plate in which shallow rectangular fitting hole 46 and optical fiber fixing groove 47 extending in the direction of the optical axis to the fitting hole are made. Si bench 48 having the same size as the fitting hole 46 is embedded in the fitting hole 46. The surfaces of the Si bench 48 and the retaining substrate 45 come to almost the same height. Thin V groove 49 is formed in the front lower portion 48 of the Si bench 57 by means of anisotropic etching. A metallized pattern (not illustrated) is printed on the Si bench. LD 50 is fixed on the Si bench 48 along the extended line from V groove 49 Monitoring PD 53 is fixed just behind the LD 50.

Ferrule or the like 51 is inserted into the optical fiber fixing groove 47, and optical fiber ribbon 52 is inserted into the V groove 49. These portions are adhered by an adhesive. The horizontal position of the optical fiber ribbon 52 is determined by the V groove. Also, the front end of the ribbon comes into contact with the step portion of the Si bench, whereby the position in the axial direction of the ribbon is determined. Receiving PD 54 and WDM filter 55 are attached onto front lower surface 57 of the Si bench 48 so as to be across the optical fiber ribbon 52. Amplifier 56 is provided at their side. This amplifier is provided for amplifying electric signals from the PD, and is not on the Si bench but on the retaining substrate 45. Therefore, it is unnecessary to increase the area of the Si bench.

The LD 50 generates a modulated optical signal. This signal is transmitting light. The transmitting light exits from the LD 50, enters the optical fiber ribbon 52, and propagates inside the optical fiber. The receiving light that has propagated inside the optical fiber is selectively reflected by the WDM filter 55 to advance diagonally upward, and is made incident onto the PD 54. Since the transmitting light $\lambda 1$ and the receiving light $\lambda 2$ are different from each other, simultaneous bidirectional communication is possible. For example, $\lambda 1$ may be in a 1.3 $\mu$m band, and $\lambda 2$ may be in a 1.55 $\mu$m band. The WDM filter is inserted to separate both the transmitting light and receiving light.

This Si bench may have the same 3 mm width as mentioned above. However, since the monitoring PD, the receiving PD, and the WDM filter are added, the length of the bench becomes longer than that of embodiments 1 and 2. The length may be 6 mm through 8 mm.

In this embodiment, optical parts called electric optical devices including an LD, a monitoring PD, a receiving PD, a WDM filter and the like are mounted on the Si bench. The ferrule 51 or the like and the amplifier 56 are mounted on the retaining substrate 45. In comparison with FIG. 2 and FIG. 3, the Si bench can be made smaller in this case.

Embodiment 4

This is also an example of the transmitter and receiver module. In embodiment 3 shown in FIGS. 10 and 11, the transmitting LD and the receiving PD are closer to each other. Since they are close to each other, particularly, when correctly receiving an optical signal which has weakened due to long-distance transmission, leak light from the transmitting LD and electromagnetic noise of a drive electric signal of the LD may mix into the receiver circuit of the PD. Embodiment 4 solves this problem. This embodiment is explained with reference to FIGS. 12 and 13.

Retaining substrate 59 is a rectangular plate in which shallow rectangular fitting hole 62 and optical fiber fixing groove 60 extending in the direction of the optical axis to the fitting hole 62 are made in the surface. Si bench 63 having the same size as that of the fitting hole 62 is embedded in the fitting hole 62. The surfaces of the Si bench 63 and the retaining substrate 59 come to nearly the same height. Thin V groove 64 is formed in the direction of the optical axis at the front lower portion 70 of the Si bench 63 by means of anisotropic etching. A metallized pattern (not illustrated) for wiring is printed on the Si bench 63. LD 65 is attached on the Si bench 63 along the extended line from the V groove 64. Monitoring PD 66 is fixed on the retaining substrate 59 just behind the LD 65. Thereby, the monitoring PD 66 is excluded from the Si bench, and the area of the Si bench is reduced.

Ferrule 71 or the like is inserted into the optical fiber fixing groove 60 of the retaining substrate 59. Optical fiber ribbon 72 is inserted into through groove 61 of the retaining substrate 59 and V groove 64 of Si bench 63. These portions are adhered with an adhesive. The horizontal position of the optical fiber ribbon 72 is determined by the V groove 64. Furthermore, the front end of the ribbon comes into contact with the step portion of the Si bench, whereby the position in the axial direction is determined. Only the V groove 64 and the optical fiber ribbon 72 are provided at the front lower portion 70 of the Si bench 63, and a PD and a WDM filter are not provided at the portion. Therefore, the area of the Si bench can be further reduced.

Receiving PD 67 and WDM filter 69 are attached so as to be across the through groove 61 of the retaining substrate 59. Amplifier 68 is provided by the side of the PD 67. This is provided for amplifying electric signals from the PD, and is not on the Si bench but on the retaining substrate 59.

The LD 65 generates a modulated optical signal. This is the transmitting light. The transmitting light exits LD 65, enters the optical fiber ribbon 72, and propagates inside the optical fiber. On the other hand, the receiving light that has propagated inside the optical fiber is selectively reflected by the WDM filter 69 to advance diagonally upward, and is made incident onto the PD 67. Since the transmitting light λ1 and the receiving light λ2 are different from each other, simultaneous bidirectional communication is possible. For example, λ1 may be in a 1.3 μm band, and λ2 may be in a 1.55 μm band. To the contrary, λ1 may be in the 1.55 μm band, and λ2 may be in the 1.3 μm band. The WDM filter is necessary to separate the transmitting light and the receiving light which are different in wavelength.

In embodiment 4, only the front end of an optical fiber and an LD, which need positional accuracy, are mounted on the Si bench. Optical parts including a monitoring PD, receiving PD, WDM filter and others, electric optical parts, and an amplifier are mounted on the retaining substrate. Thereby, the distance between the receiving PD and the transmitting LD can be made wide. The front bottom portion 70 of the Si bench spatially separates the PD and the LD. This is effective to reduce crosstalk.

The Si bench has the same 3 mm×5 mm size as that of embodiment 1 or 2 which is a transmitter or receiver module. This size can be reduced up to 3 mm×3 mm. The retaining substrate is made from a liquid crystal polymer, and has an 11 mm×7 mm×2 mm size. The transmitting LD is an InGaAsP-FP-LD of 1.3 μm. The monitoring PD is a PD whose light receiving layer is InGaAs. The WDM filter is formed by laminating a dielectric multi-layer film on a polyimide thin film. The filter has a characteristic whereby it transmits 1.3 μm light that has been made incident onto the filter at a fixed angle, and reflects 1.55 μm light. Only the LD and the optical fiber front end are provided on the Si bench. This is a transmitter and receiver module based on a bold idea in which the monitoring PD, receiving PD, and WDM filter are allocated on the retaining substrate. In this module, the Si bench is extremely small.

Figure 4:
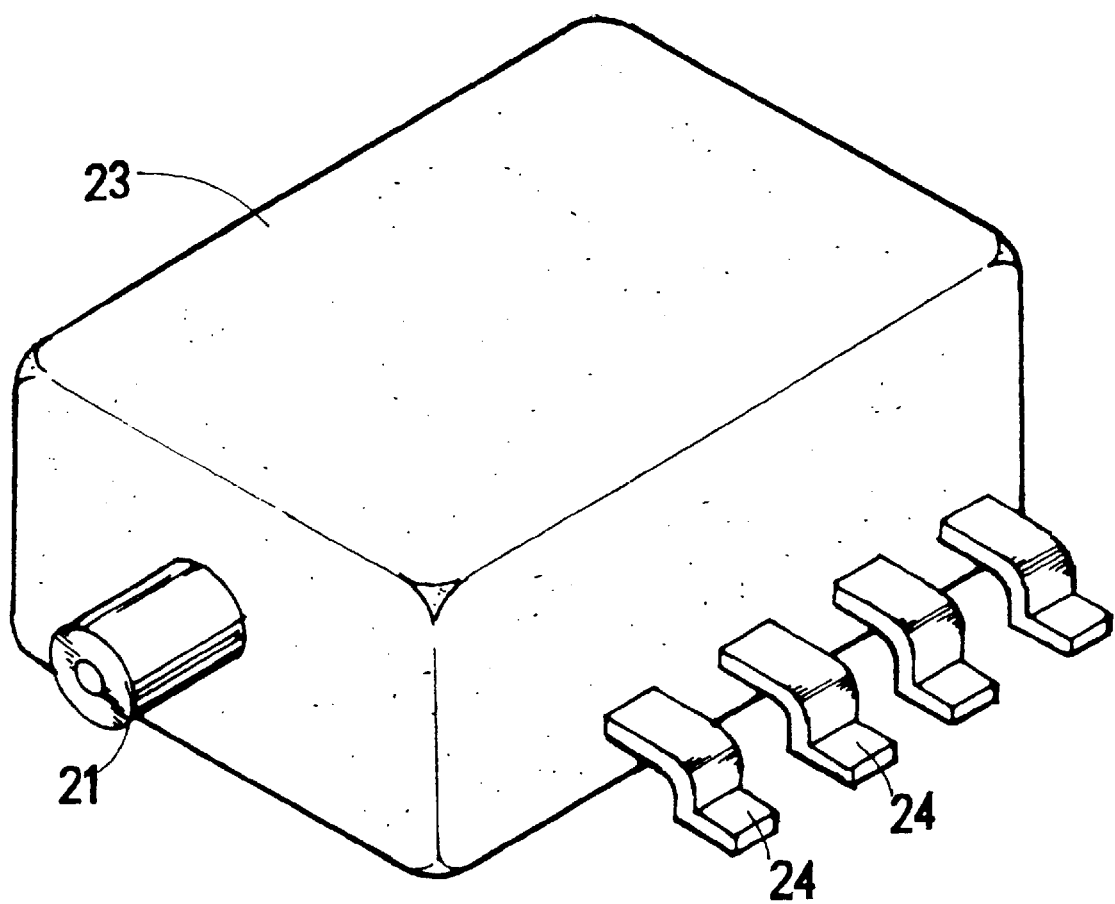
FIG. 4 is a perspective view of a device formed by resin-molding after mounting the module of an embodiment.
Figure 5:
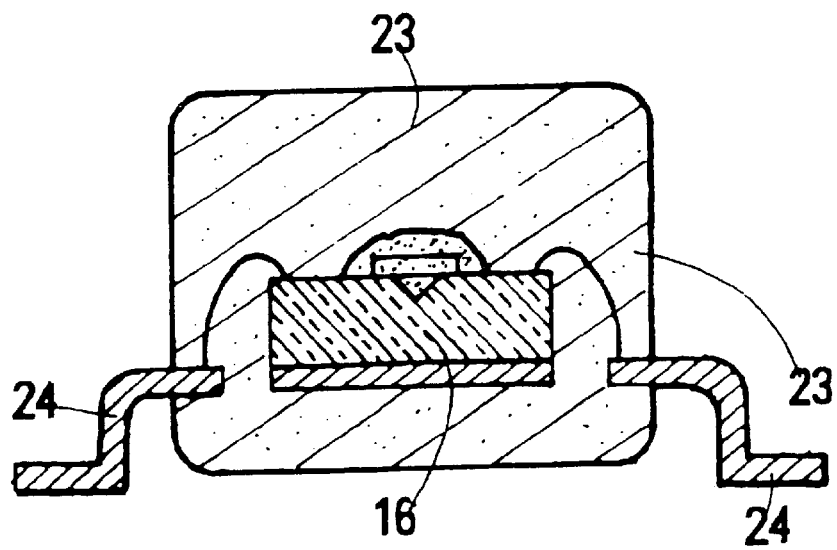
FIG. 5 is a sectional view of a device of FIG. 4 packaged by a resin.
Figure 12:
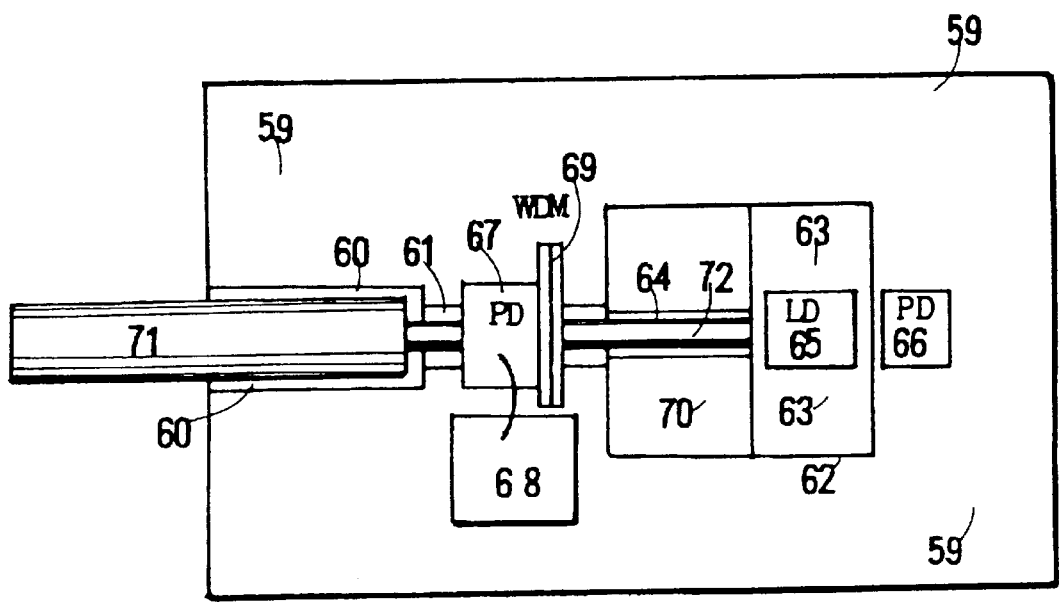
FIG. 12 is a plane view of a transmitter and receiver module in which a receiver PD and a monitor PD are not mounted on an Si bench, which relates to embodiment 4.
Figure 13:
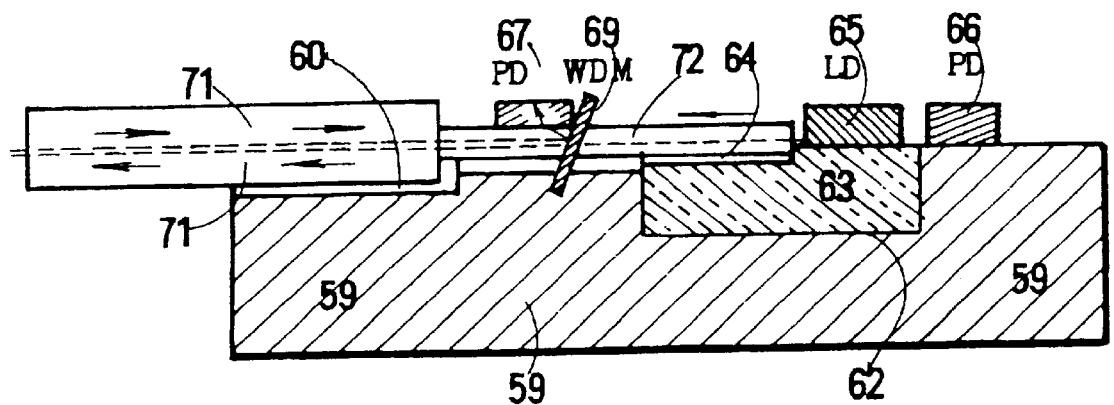
FIG. 13 is a sectional view of a transmitter and receiver module in which a receiver PD and a monitor PD are not mounted on an Si bench, which relates to embodiment 4.

Processes following those shown in FIGS. 12 and 13 are as follows. That is, the retaining substrate is placed on and coupled with a lead frame. The electrodes of the optical parts including the PD and the LD are connected to the lead frame by means of wire bonding. The LD, receiving PD, monitoring PD, and amplifier are molded by using a silicon-based resin based on the transfer-mold technique. Then, the mold is processed into the form as shown in FIG. 4 to be housed in a resin package. FIG. 4 is a perspective view of an embodiment of the device obtained by resin-molding the module on which surface-mounting has been applied, and FIG. 5 is a sectional view of FIG. 4. The portion 21 of the ferrule is exposed to the outside, and the lead portions 24 of the lead frame are for external wiring. Optical parts such as a PD and an LD are mounted on the Si bench 16, and are connected to the lead frame by wires. The entirety is molded from resin 23.

As a result, the same performance as that of the transmitter and receiver (the abovementioned "receptacle type bidirectional wavelength division multiplexing module"), in which three-dimensional type individual parts are combined which has been presented by Kogusu and others, was obtained.

Embodiment 5

Figure 14:
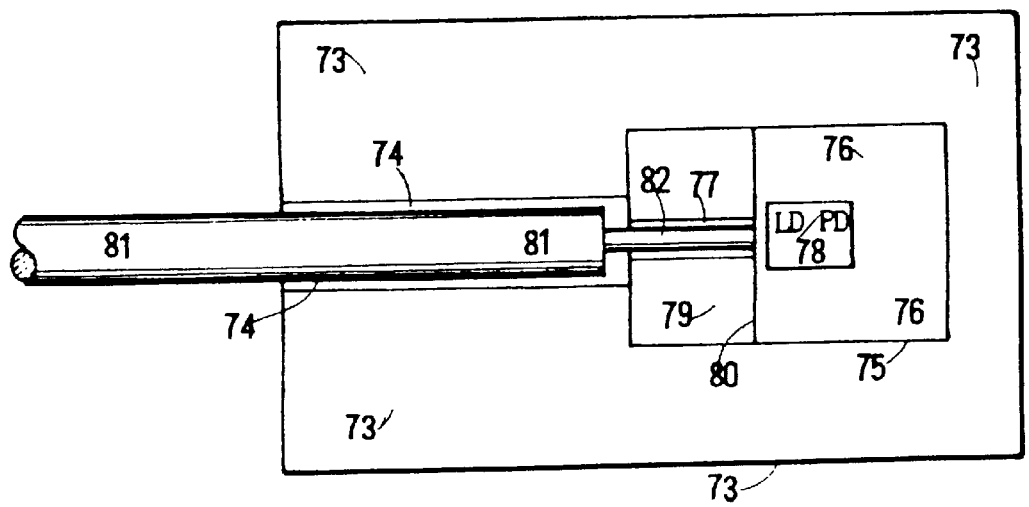
FIG. 14 is a plane view of a transmitter module or a receiver module in which an Si bench is united with a retaining substrate, and optical fibers are connected so as to be continued, which relates to embodiment 5.
Figure 15:
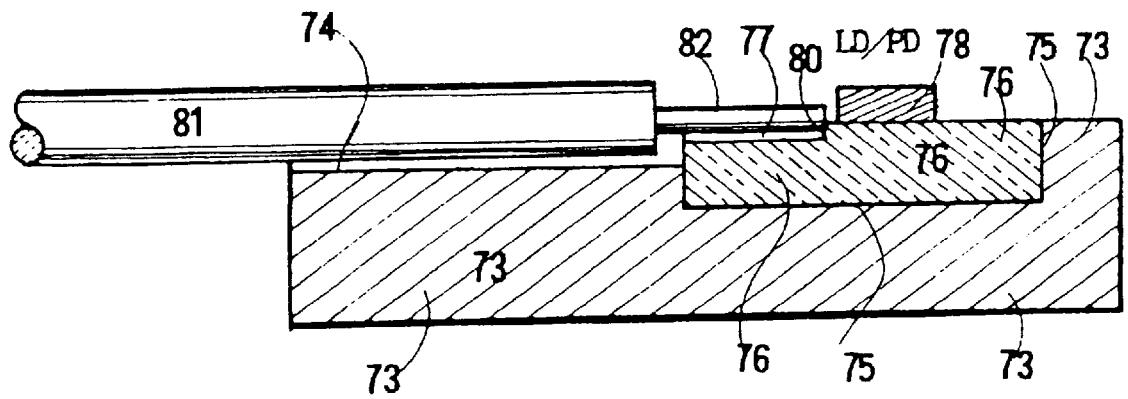
FIG. 15 is a sectional view of a transmitter module or a receiver module in which an Si bench is united with a retaining substrate, and optical fibers are connected so as to be continued, which relates to embodiment 5.
Figure 16:
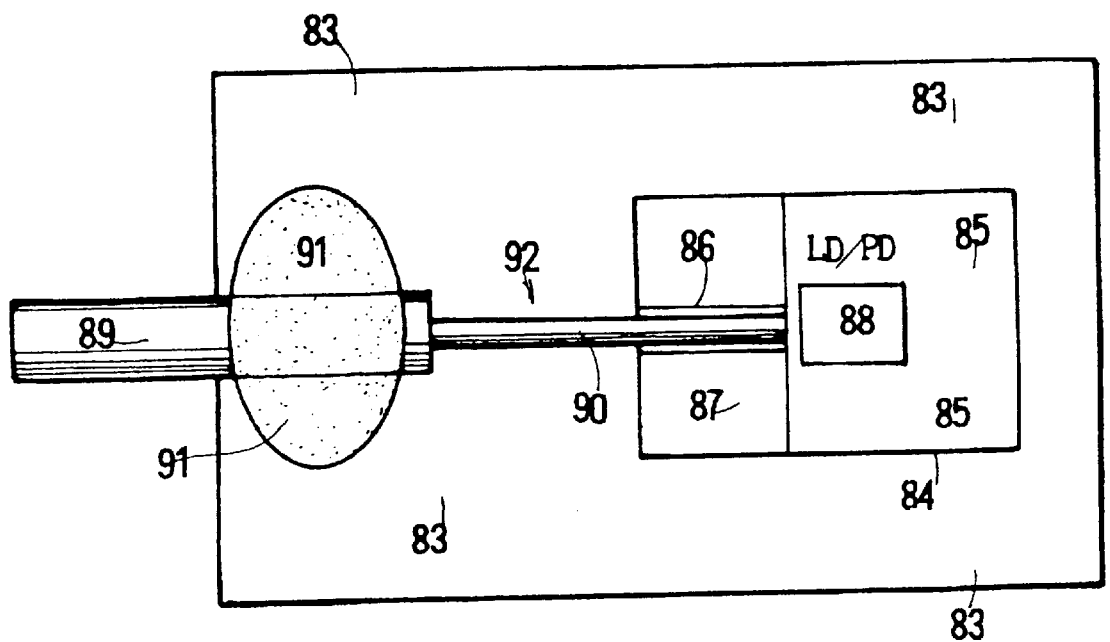
FIG. 16 is a plane view of a transmitter module or a receiver module in which a lead frame is used as a retaining substrate and an optical fiber is fixed by a resin, which relates to embodiment 6.

In embodiment 1, the optical fiber or the ferrule retaining the optical fiber is the portion which transmits signals to the outside. In either case, the portion projects only slightly from the device end. Therefore, after resin molding, the device becomes that as shown in FIG. 4 and FIG. 5. The invention may be a device to be provided at the end portions of continuous optical fibers. FIG. 14 is a plane view of the module of embodiment 5, and FIG. 15 is a longitudinal section of the same. Except for the different optical fiber, the construction is the same as that of embodiment 1.

Retaining substrate 73 is a rectangular plate in which optical fiber fixing groove 74 in the direction of the optical axis and shallow rectangular fitting hole 75 at the terminal of the fixing groove are made in the surface. Si bench 76 having the same size as that of the fitting hole 75 is embedded in the fitting hole 75. The surfaces of the Si bench 76 and the retaining substrate 73 come to almost the same height. V groove 77 is formed in the direction of the optical axis at the front lower portion 79 of the Si bench 76 by means of anisotropic etching. LD/PD 78 is fixed on the Si bench along the extended line from the V groove 77.

Ferrule 81 or the like is inserted into the optical fiber fixing groove 74, and optical fiber ribbon 82 is inserted into the V groove 77. These portions are adhered with an adhesive. The horizontal position of the optical fiber ribbon 82 is determined by the V groove 77. Furthermore, the front end of the ribbon comes into contact with the step portion 80 of the Si bench, whereby the position in the direction of the optical axis is determined. In the case where the LD/PD 78 is an LD, the module is a transmitter module. Transmitting light exits from the LD and enters the optical fiber. In the case where the LD/PD 78 is an PD, the module is a receiver module. Receiving light that has exited from the optical fiber enters the PD from the side.

The Si bench has a 5 mm×3 mm size. The retaining substrate has an 11 mm×7 mm×2 mm size. The material of the retaining substrate is an epoxy resin, liquid crystal polymer, plastic molded member, ceramic, or the like. This feature is useful in the case where the module is connected to a pigtail type optical connector.

Embodiment 6

Figure 17:
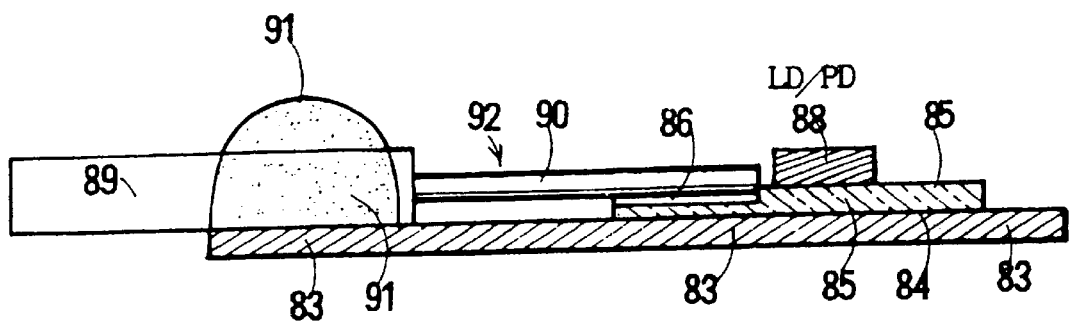
FIG. 17 is a sectional view of a transmitter module or a receiver module in which a lead frame is used as a retaining substrate and an optical fiber is fixed by a resin, which relates to embodiment 6.
Figure 18:
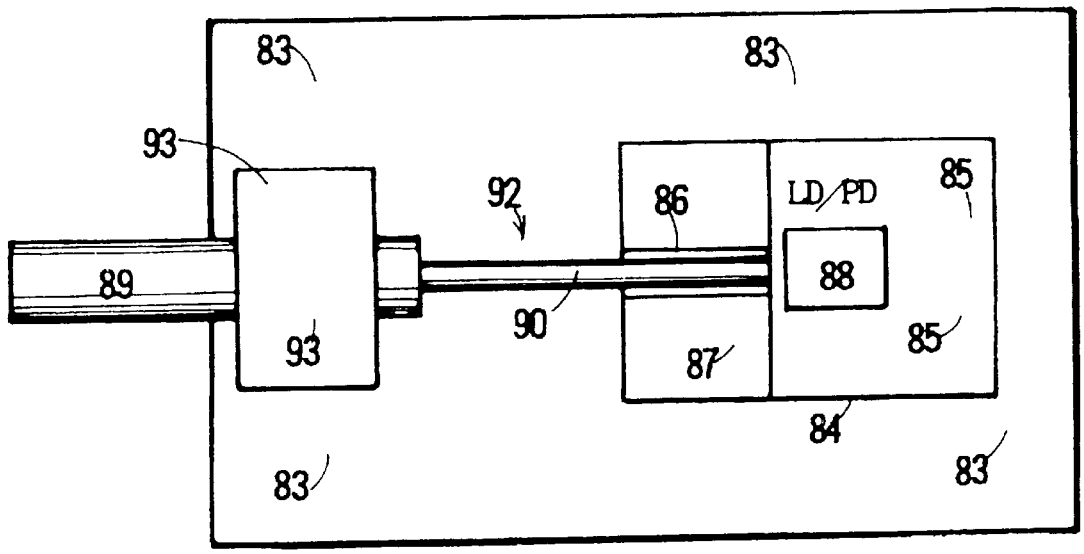
FIG. 18 is a plane view of a transmitter module or a receiver module in which a lead frame is used as a retaining substrate and an optical fiber is fixed by a fixing part.

In embodiment 2, the lead frame itself is used as the retaining substrate. At this time, some portions of the lead frame are cut and raised to form fixing claws. Optical fiber may be fixed by a resin in place of the claws. Embodiment 6 is such an example. A plane view is shown in FIG. 17, and a longitudinal section is shown in FIG. 18. Lead frame 83 serves as both the lead frame itself and a retaining substrate. The lead frame is a thin metal plate made from a good conductor, and is provided with a number of pins directed inward at the four sides. Herein, illustration of the pins is omitted. An appropriate attaching portion 84 is selected, and Si bench 85 is fixed onto the portion with a conductive adhesive. Due to its thickness the Si bench 85 is higher than the surface of the lead frame 83. Thin V groove 86 is formed in the direction of the optical axis at the front lower portion 87 of the Si bench 85 by means of anisotropic etching. LD/PD 88 is fixed on the Si bench along the extended line from the V groove 86.

Ferrule 89 or the like is fixed on the lead frame 83 by resin 91. Optical fiber ribbon 90 is a inserted and adhered in the V groove 86. The horizontal position of the optical fiber ribbon 90 is accurately determined by the V groove 86. In the case where the LD/PD 88 is an LD, the module is a transmitter module. In the case where the LD/PD 88 is a PD, the module is a receiver module.

Since no fixing claws are provided, minimal distortion or deformation occurs in the lead frame. The use of the adhesive makes it easier to fix the optical fiber. The spare space 92 between the adhesive resin 91 and the Si bench 85 is made wide to lengthen the exposed portion of the optical fiber by 1 to 2 mm. Thereby, even if the optical fiber deviates slightly from the optical axes of the ferrule fixing portion and the optical coupling portion, the deviation is absorbed.

Embodiment 7

In the case where a lead frame is used as a retaining substrate, optical fiber can be fixed onto the lead frame by using a special fixing part in place of the claws and adhesive. Embodiment 7 is an example of fixation by using a part.

Figure 19:
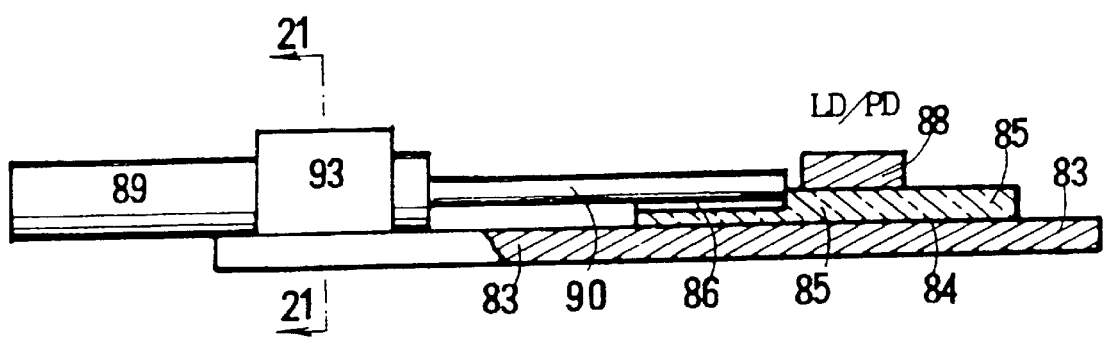
FIG. 19 is a sectional view of a transmitter module or a receiver module in which a lead frame is used as a retaining substrate and an optical fiber is fixed by a fixing part.
Figure 20:
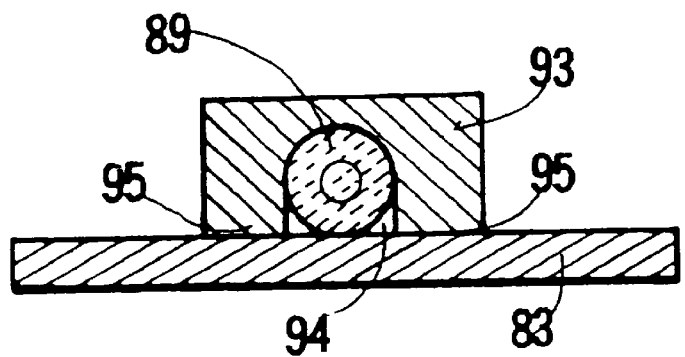
FIG. 20 is a sectional view along the line 21—21 of FIG. 19.

FIG. 18 is a plane view, FIG. 19 is a longitudinal section, and FIG. 20 is a cross sectional view of the portion with a fixing part.

Retaining substrate 83 is a lead frame itself. Since the substrate is a lead frame, it is a thin metal plate made from a good conductor, and is provided with a number of pins directed inward at the four sides. Herein, illustration of the pins is omitted. An appropriate attaching portion 84 is selected, and Si bench 85 is fixed onto the portion by a conductive adhesive. Due to its thickness, the Si bench 85 is higher than the surface of the retaining substrate 83. Thin V groove 86 is formed in the direction of the optical axis at the front lower portion 87 of the Si bench by means of anisotropic etching. LD/PD 88 is fixed on the Si bench along the extended line from the V groove 86.

Ferrule 89 or the like is fixed onto the lead frame 83 by fixing part 93. Optical fiber ribbon 90 is inserted and adhered in the V groove 86. The horizontal position of the optical fiber ribbon 90 is accurately determined by the V groove 86. FIG. 20 is a cross section of the portion with the fixing part. The fixing part 93 is a concave jig having hole 94 whose shape is equal to the outer shape of the ferrule 89 or the like. The ferrule 89 or the like is retained by the hole 94. The lead frame 83 is soldered to leg portions 95.

Since no fixing claws are provided, minimal distortion or deformation occurs in the lead frame. The fixation is achieved without the use of an adhesive, so there is less aging deterioration. Furthermore, an optical fiber can be fixed at a more accurate position.

Embodiment 8

Figure 21:
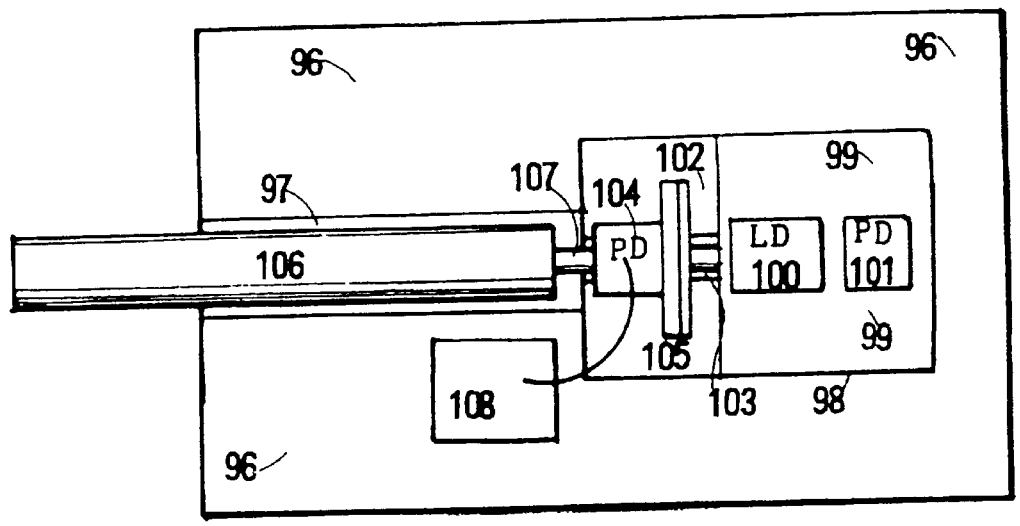
FIG. 21 is a plane view of a single wavelength time-division transmission type transmitter and receiver module in which a receiver PD and a monitor PD are mounted on an Si bench, which relates to embodiment 8.
Figure 22:
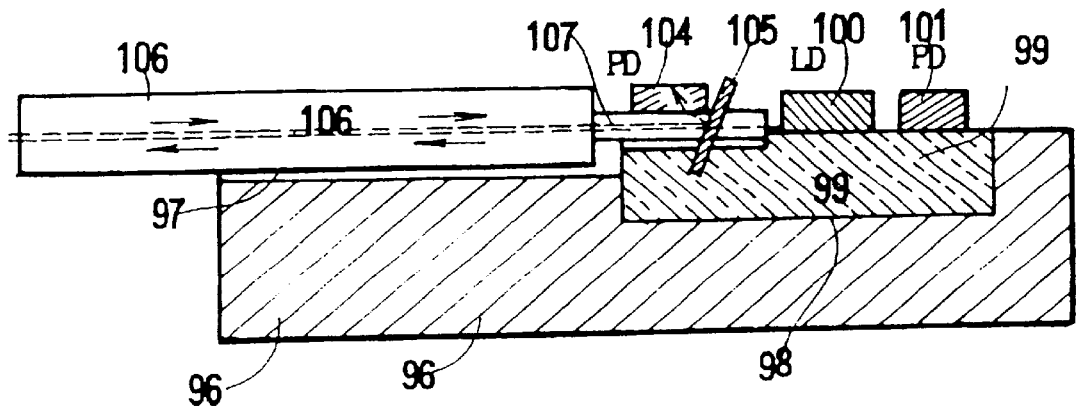
FIG. 22 is a sectional view of a single wavelength time-division transmission type transmitter and receiver module in which a receiver PD and a monitor PD are mounted on an Si bench, which relates to embodiment 8.

An example of a transmitter and receiver module using light with the same wavelength is explained. Since light with the same wavelength is used, a half mirror is used in place of the WDM filter. Transmittance and receiving are time-divided and carried out at different times. This is ping-pong transmission. This embodiment is similar to embodiment 3, however, the WDM filter is replaced by a half mirror. A plane view of this embodiment is shown in FIG. 21 and a longitudinal section of the same is shown in FIG. 22.

Retaining substrate 96 is a rectangular plate in which optical fiber fixing groove 97 extending in the direction of the optical fiber and rectangular fitting hole 98 are made in the surface. Si bench 99 having the same size as the fitting hole 98 is embedded in the fitting hole. The surfaces of the Si bench 99 and the retaining substrate 96 come to the same height. Thin V groove 103 is formed in the direction of the optical axis at the front lower portion 102 of the Si bench 99 by means of anisotropic etching. A metallized pattern (not illustrated) is printed on the Si bench 99. LD 100 is fixed on the Si bench 99 along the extended line from the V groove 103. Monitoring PD 101 is fixed on the Si substrate just behind the LD 100.

Ferrule 106 or the like is inserted into the optical fiber fixing groove 97, and optical fiber ribbon 107 is inserted into the V groove 103, and they are fixed with an adhesive. The optical fiber ribbon 107 is positioned by the V groove 103. Receiving PD 104 and half mirror 105 are attached onto the front lower surface 102 of the Si bench 99 so as to be across the V groove 103 and the optical fiber ribbon 107. Amplifier 108 is provided at the side of the front lower surface. This amplifier is provided for amplifying electric signals from the PD, and is not on the Si bench but on the retaining substrate 96. Therefore, it is not necessary to increase the area of the Si bench.

Transmitting light and receiving light have the same wavelength. For example, light in a 1.3 μm band is used. Or, light in a 1.55 μm may be used. Due to the same wavelength, selective reflection and transmission by the WDM filter are not possible. Therefore, half mirror 105 is used to transmit and reflect light with one wavelength half and half.

Embodiment 9

Figure 23:
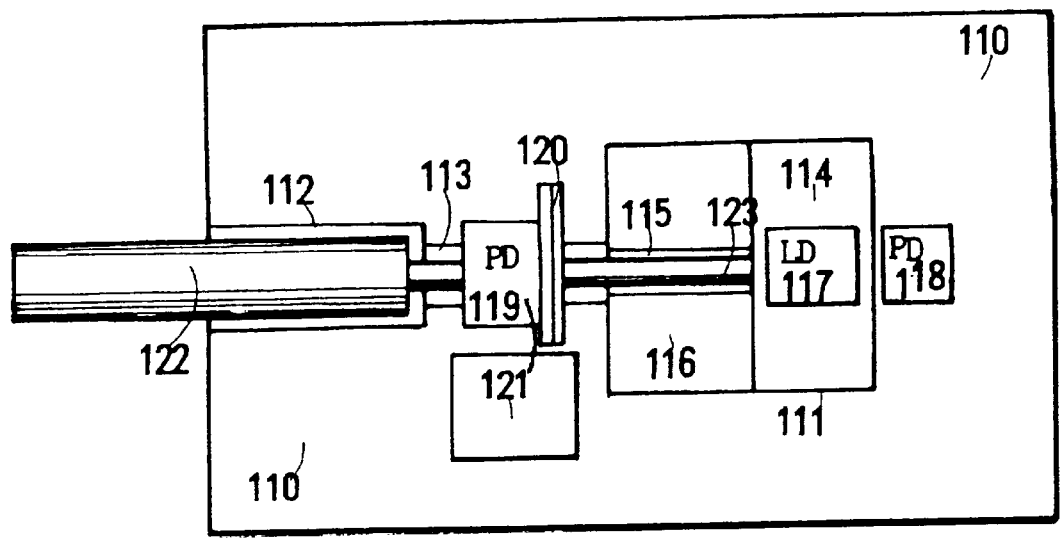
FIG. 23 is a plane view of a single wavelength time-division transmission type transmitter and receiver module in which a receiver PD and monitor PD are not mounted on an Si bench, which relates to embodiment 9.
Figure 24:
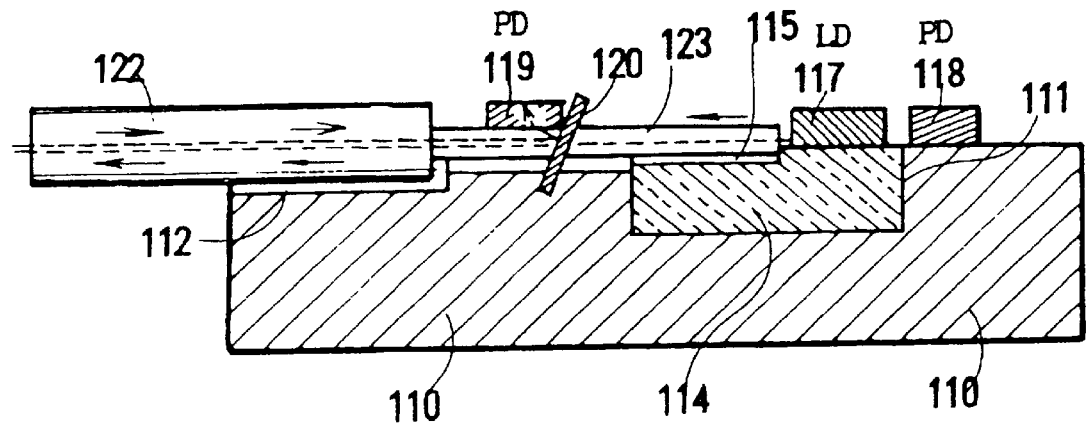
FIG. 24 is a sectional view of a single wavelength time-division transmission type transmitter and receiver module in which a receiver PD and monitor PD are not mounted on an Si bench, which relates to embodiment 9.

Embodiment 9 is an example of a single wavelength ping-pong transmitter and receiver module. This embodiment is explained with reference to FIG. 23 and FIG. 24.

Retaining substrate 110 is a rectangular plate in which shallow rectangular fitting hole 111, optical fiber fixing groove 112 in the direction of the optical axis, and through groove 113 are made in the surface. Si bench 114 having the same size as the fitting hole 111 is embedded into the fitting hole. Thin V groove 114 is formed in the direction of the optical axis at the front lower portion 116 of the Si bench 114 by means of anisotropic etching. A metallized pattern (not illustrated) for wiring is printed on the Si bench 114. LD 117 is attached to the Si bench 114 along the extended line from the V groove 115. Monitoring PD 118 is fixed onto the retaining substrate 110 just behind the LD 117. Thereby, the monitoring PD 118 is excluded from the Si bench 114 to reduce the Si bench area.

Ferrule 122 or the like is inserted into the optical fiber fixing groove 112 of the retaining substrate 110. The optical fiber ribbon 123 is inserted and fixed into the through groove 113 of the retaining substrate 110 and the V groove 115 of the Si bench 114. Only the V groove 115 and the optical fiber ribbon 123 exist at the front lower surface 116 of the Si bench 114, and a PD and a half mirror are not provided at the portion. Therefore, the Si bench area can be further reduced.

Receiving PD 119 and half mirror 120 are attached so as to be across the through groove 113 of the retaining substrate 110. Amplifier 121 is provided at the side of the PD 119. The monitoring PD 118, receiving PD 119, amplifier 121, and half mirror 120 are provided on the retaining substrate, so that the Si bench can be made small.

INDUSTRIAL APPLICABILITY

The invention relates to a device with a double-substrate structure in which two types of substrates are used for each purpose. A semiconductor single crystal substrate such as an Si substrate or the like is used only for the portion requiring high accuracy, and an inexpensive retaining substrate made from plastic, ceramic, or liquid crystal polymer is used for the other portion for which low accuracy is sufficient. Therefore, a great deduction of the material cost can be achieved than with the conventional surface mounting module using an Si bench over its entirety. Thereby, a less expensive surface mounting type transmitter module, receiver module, and transmitter and receiver module can be provided.

What is claimed is:

1. An optical communication device comprising a ferrule with an optical fiber, optical parts, and a substrate for optical coupling, wherein the substrate is composed of a semiconductor bench having a size, and a retaining substrate, said retaining substrate having a fitting hole which has a size substantially the same as the size of said semiconductor bench whereby said semiconductor bench is embedded in said retaining substrate;

an end portion of the ferrule and the coupling portion of the optical parts are fixed onto the semiconductor bench having a V groove by means of etching; and a portion of the ferrule other than the end portion is fixed by the retaining substrate.

2. An optical communication device as set forth in claim 1, wherein,
as a means for fixing the ferrule onto the retaining substrate, the ferrule is placed inside the optical fiber fixing groove made in the retaining substrate and fixed by a resin.

3. An optical communication device as set forth in claim 1, wherein
the semiconductor bench is a substrate of an Si single crystal semiconductor, a GaAs single crystal semiconductor, or an InP single crystal semiconductor.

4. An optical communication device as set forth in claim 1 wherein
the retaining substrate is made from ceramic, plastic, or liquid crystal polymer.

5. An optical communication device as set forth in claim 1, wherein
the optical parts are any one or a combination of an LD or light emitting element, a PD or light receiving element, a mirror, a WDM filter, and a spectroscopic element.

6. An optical communication device as set forth in claim 1, wherein
the semiconductor bench is an Si bench;
a V groove is formed at a part of the Si bench and a single mode optical fiber is fixed therein;
an InGaAsP-based semiconductor laser (LD) is fixed on a part of a remainder portion of a same surface of the bench; and
the ferrule and the Si bench are fixed onto a resin-made retaining substrate having an optical fiber fixing groove for fixing the ferrule.

7. An optical communication device as set forth in claim 1, wherein the semiconductor bench is an Si bench;
a V groove is formed in a part of the Si bench to fix a single mode optical fiber;
an InGaAsP-based PD or light receiving element is fixed on a part of a remainder portion of a same surface of the Si bench; and
the ferrule and the Si bench are fixed onto the resin-made retaining substrate having an optical fiber fixing groove for fixing the ferrule.

8. An optical communication device as set forth in claim 1, wherein
the optical communication device is used for single-fiber bi-directional communication; and wherein
the semiconductor bench is a Si bench;
an optical fiber ribbon, a LD, a monitoring PD, a PD, and a WDM filter are mounted on the Si bench; and
the Si bench and the ferrule are fixed onto the retaining substrate.

9. An optical communication device as set forth in claim 8, wherein
an amplifier for amplifying signals from the PD is provided on the retaining substrate.

10. An optical communication device for single-fiber bidirectional communication as set forth in claim 8, wherein
transmitting light is in a 1.3 $\mu$m band and receiving light is in a 1.55 $\mu$m band, or transmitting light is in the 1.55 $\mu$m band and receiving light is in the 1.3 $\mu$m band.

11. An optical communication device for single-fiber bidirectional communication as set forth in claim 10, wherein
the transmitting LD is an InGaAsP-based semiconductor laser, and the receiving PD is an InGaAsP-based PD or APD.

12. An optical communication device for single-fiber bidirectional communication as set forth in claim 1, wherein
the semiconductor bench is a Si bench;
an optical fiber ribbon, a LD, a monitoring PD, a PD, and a half mirror are mounted onto the Si bench; and
the Si bench and the ferrule are fixed onto the retaining substrate.

13. An optical communication device for single-fiber bidirectional communication as set forth in claim 12, wherein
both transmitting light and receiving light are in a 1.3 $\mu$m band or a 1.55 $\mu$m band.

14. An optical communication device for single-fiber bidirectional communication as set forth in claim 1, wherein
the semiconductor bench is a Si bench;
an optical fiber ribbon and a LD are mounted onto the Si bench; and
the Si bench, the ferrule, a monitoring PD, a PD, and a half mirror are fixed onto the retaining substrate.

15. An optical communication device for single-fiber bidirectional communication as set forth in claim 1, wherein
the semiconductor bench is a Si bench;
an optical fiber ribbon and a LD are mounted onto the Si bench;
the Si bench, a part of the ferrule, a monitoring PD, a PD, and a WDM filter are fixed onto the retaining substrate.

16. An optical communication device as set forth in claim 1, wherein
the Si bench and the entirety of the retaining substrate are formed on the lead frame in a united manner; and
they are molded by a resin so that the front end of the ferrule and the lead portion are exposed.

* * * * *